(12) United States Patent
Song

(10) Patent No.: US 7,567,599 B2
(45) Date of Patent: Jul. 28, 2009

(54) SEMICONDUCTOR LASER DIODE DEVICE WITH THERMAL CONDUCTIVE ENCAPSULATING RESIN AND METHOD FOR MANUFACTURING THE SAME

(75) Inventor: Chang Ho Song, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 317 days.

(21) Appl. No.: 11/125,225

(22) Filed: May 10, 2005

(65) Prior Publication Data

US 2006/0146899 A1 Jul. 6, 2006

(30) Foreign Application Priority Data

Jan. 3, 2005 (KR) .................. 10-2005-0000247

(51) Int. Cl.
*H01S 3/04* (2006.01)

(52) U.S. Cl. .............. 372/36; 257/678; 257/687; 257/701; 257/702; 257/705; 257/712; 372/34

(58) Field of Classification Search ............. 264/255, 264/272.11, 271.1
See application file for complete search history.

(56) References Cited

U.S. PATENT DOCUMENTS

| | | | | |
|---|---|---|---|---|
| 4,152,624 | A * | 5/1979 | Knaebel | 313/499 |
| 6,315,936 | B1 * | 11/2001 | Black et al. | 264/272.13 |
| 6,375,125 | B1 * | 4/2002 | Kirn et al. | 244/172.3 |
| 6,456,635 | B1 * | 9/2002 | Shiomoto et al. | 372/36 |
| 6,829,266 | B2 * | 12/2004 | Uchida et al. | 372/36 |
| 7,111,380 | B2 * | 9/2006 | Sheeran et al. | 29/596 |
| 7,227,877 | B2 * | 6/2007 | Tsuji | 372/36 |
| 2003/0235223 | A1 * | 12/2003 | Koizumi | 372/36 |
| 2004/0004227 | A1 * | 1/2004 | Tateishi | 257/99 |
| 2004/0037076 | A1 * | 2/2004 | Katoh et al. | 362/235 |
| 2004/0037334 | A1 * | 2/2004 | Funada et al. | 372/43 |

FOREIGN PATENT DOCUMENTS

| | | |
|---|---|---|
| JP | 64-024488 A | 1/1989 |
| JP | 09-008404 A | 1/1997 |
| JP | 2000-357839 A | 12/2000 |
| JP | 2001-111156 A | 4/2001 |
| JP | 2002/176222 | 6/2002 |
| JP | 2002-314185 A1 | 10/2002 |
| JP | 2003/110181 | 4/2003 |

OTHER PUBLICATIONS

"Aluminum Oxide" Accuratus http://www.accuratus.com/alumox. html.*
Digital library and archives http://scholar.lib.vt.edutheses/available/etd.*
Japanese Patent Office, Office Action mailed Dec. 25, 2007 and English Translation.

* cited by examiner

*Primary Examiner*—Minh-Loan T Tran
*Assistant Examiner*—Fei Fei Yeung Lopez
(74) *Attorney, Agent, or Firm*—Lowe Hauptman Ham & Berner

(57) ABSTRACT

A semiconductor laser diode device comprises a semiconductor laser diode, a primary lead having a sub-mount for mounting the semiconductor laser diode, at least one secondary lead electrically insulated from the primary lead, a first resin member for integrally fixing the primary lead and the secondary lead while insulating the primary lead from the secondary lead, and a second resin member having an emitting opening through which laser beams generated by the semiconductor laser diode are emitted to the outside, and surrounding the primary lead and the first resin member so as to dissipate heat transferred to the primary lead and the first resin member to the outside.

40 Claims, 11 Drawing Sheets

SEMICONDUCTOR LASER DIODE DEVICE WITH THERMAL CONDUCTIVE ENCAPSULATING RESIN AND METHOD FOR MANUFACTURING THE SAME

RELATED APPLICATION

The present invention is based on, and claims priority from, Korean Application Number 2005-000247, filed Jan. 3, 2005, the disclosure of which is incorporated by reference herein in its entirety.

BACKGROUND OF THE INVENTION

1. Field of the Invention

The present invention generally relates to a semiconductor laser diode device, and, more particularly, to a semiconductor laser diode device and a method of manufacturing the same, designed to provide excellent heat dissipation, thereby extending the life span of products manufactured from the semiconductor laser diode device, and to reduce the number of components while simplifying an assembly process, thereby reducing manufacturing costs.

2. Description of the Related Art

Generally, a semiconductor laser diode device is operated using electrical properties and optical properties of a p-n junction semiconductor diode adapted to generate laser oscillation by forward current injection, and has various applications including laser pointers, laser printers, scanners, data storage, such as CD-P, CD-ROM, CD-RW, DVD-P, DVD-ROM and the like, and optical pick-up apparatuses.

Such a conventional semiconductor laser diode device is classified into a can-type, and a resin molded lead frame-type according to the shape of the semiconductor laser diode device. Referring to FIG. 1, a can-type semiconductor laser diode device 10 is illustrated, which comprises a laser chip 19 for emitting laser beams, a sub-mount 11 for mounting the laser chip 19 on the top surface thereof, a heat dissipation member 13 protruded a predetermined height from the top surface of a disk-shaped stem 12 for mounting the sub-mount 11, and a plurality of leads 14 extended downward from the stem 12 to be electrically connected to a main substrate (not shown). Each of the leads 14 is electrically connected to the laser chip 19 via a wire 15.

The semiconductor laser diode device 10 further comprises a cap member 16 having an emitting opening 16a at the center of the upper surface thereof and mounted on the stem 12 for protecting the laser chip 19 and the sub-mount 11 from the external environment, and a glass member 17 mounted on the upper surface of the cap member 16, so that the laser beam passes through the emitting opening 16a and the glass member 17.

In such a conventional can-type semiconductor laser diode device 10, the cap member 16 made of metal is assembled to the stem 12, and the glass member 17 is assembled to the emitting opening 16a of the cap member 16 in order to enhance transmittance of light having a specific wavelength. As a result, the assembly process is complicated, and a number of components are required, thereby causing limitation in mass production and reduction of manufacturing costs.

Accordingly, in order to solve the problems of the can-type semiconductor laser diode device as described above, lead frame-type semiconductor laser diode devices constituted by a lead frame and a resin part have been developed, and an example thereof is disclosed in Japanese Patent Laid-open publication No. 2002-176222 (Laid-open Date: Jun. 21, 2002).

The semiconductor laser device of Japanese Patent Laid-open publication No. 2002-176222 comprises a first lead having a mounting portion for mounting a semiconductor laser chip, a second lead for electrodes extended downward in the vertical direction, and a resin member for holding the first and second leads, in which a connecting portion is equipped to the second lead, and connected to the resin member in the longitudinal direction of the second lead.

However, although the above semiconductor laser device has advantages of preventing the leads from being detached from the device upon electrical connection of the leads, and of reducing the size of the products, heat dissipation becomes extremely poor upon operation of the device due to restriction of heat dissipating path and the resin member made of insulation resin having low thermal conductivity. Moreover, foreign substances can be easily attached to the device by virtue of static electricity generated from the insulation resin of the resinous body, thereby damaging the laser chip.

Japanese Patent Laid-open publication No. 2003-110181 (Laid-open Date: Apr. 11, 2003) discloses a semiconductor laser device, which comprises a substrate having an opening and a conductive support for mounting a semiconductor laser chip, and first and second leads, wherein, with the second lead inserted into the opening, a resinous block fills the opening such that the leads are integrally fixed to the conductive support.

Although the semiconductor laser device of Japanese Patent Laid-open publication No. 2003-110181 has an advantage of reducing the number of components in comparison to the cap-type semiconductor laser device, the separate support must be prepared, and assembled to the lead, complicating the manufacturing process, and making it difficult to reduce the manufacturing costs. Additionally, since the insulation resin is configured to surround the semiconductor laser device, problems caused by attachment of foreign substances due to the static electricity remain.

SUMMARY OF THE INVENTION

The present invention has been made to solve the above problems, and it is an object of the present invention to provide a semiconductor laser diode device, designed to have excellent heat dissipation properties and to suppress generation of static electricity, thereby extending the life span of the products, and a method of manufacturing the same.

It is another object to provide the semiconductor laser diode device, designed to reduce the number of components while simplifying an assembly process, thereby reducing manufacturing costs, and the method of manufacturing the same.

In accordance with one aspect of the present invention, the above and other objects can be accomplished by the provision of a semiconductor laser diode device, comprising: a semiconductor laser diode; a primary lead having a sub-mount for mounting the semiconductor laser diode; at least one secondary lead electrically insulated from the primary lead; a first resin member for integrally fixing the primary lead and the secondary lead while insulating the primary lead and the secondary lead from each other; and a second resin member having an emitting opening through which laser beams generated by the semiconductor laser diode are emitted to the outside, and surrounding the primary lead and the first resin member so as to dissipate heat transferred to the primary lead and the first resin member to the outside.

The secondary lead may comprise a connecting portion electrically connected to the semiconductor laser diode or to the sub-mount via a wire, a leg extending a predetermined length downward below the connecting portion, and a latch formed at the middle of the leg.

The primary lead may further comprise a diode-disposing portion for disposing the sub-mount, a leg extending a predetermined length downward from the diode-disposing portion, and a protruded portion formed at the middle of the leg.

The first resin member may be provided with an aperture for exposing the connecting portion of the secondary lead to the outside.

The first resin member may be provided with flanges on outer surfaces of the first resin member corresponding to the second resin member for enhancing an engaging force with the second resin member.

The first resin member may be formed of an insulation resin by means of injection molding or transfer molding.

The second resin member may be formed of an insulation resin by means of injection molding or transfer molding. The insulation resin may have a thermal conductivity of 1~40 W/mK. The insulation resin may comprise a metallic filler or a graphite filler.

The emitting opening of the second resin member may be formed with a slant surface so as to prevent the laser beam emitted from the laser diode from returning thereto.

The semiconductor laser diode device may further comprise a light receiving diode for monitoring rear side emitted light. The light receiving diode may be integrally provided to the sub-mount, to the primary lead while being separate from the sub-mount, or to an inner wall of the second resin member.

In accordance with another aspect of the present invention, a method for manufacturing a semiconductor laser diode device is provided, the semiconductor laser diode device comprising: a sub-mount for mounting a semiconductor laser diode; a primary lead having the sub-mount; and at least one secondary lead electrically insulated from the primary lead, the method comprising: forming a first resin member surrounding the primary lead and the secondary lead so as to insulate the primary lead and the secondary lead from each other while fixing the primary lead and the secondary lead; and forming a second resin member surrounding the primary lead and the first resin member so as to dissipate heat transferred to the primary lead and the first resin member to the outside while forming an emitting opening in the second resin member, through which laser beams generated by the semiconductor laser diode are emitted to the outside.

The method may further comprise forming an opening through the first resin member for exposing a connecting portion formed on an upper end of the secondary lead to the outside.

The method may further comprise forming a protrusion on an outside surface of the first resin member corresponding to the second resin member for enhancing an engaging force with the second resin member.

The first resin member may be formed of an insulation resin by means of injection molding or transfer molding.

The second resin member may be formed of an insulation resin by means of injection molding or transfer molding. The insulation resin may have a thermal conductivity of 1~40 W/mK. The insulation resin may comprise a metallic filler or a graphite filler.

The emitting opening of the second resin member may be formed with a slant surface so as to prevent the laser beam emitted from the laser diode from returning thereto.

In accordance with yet another aspect of the present invention, a method of manufacturing a semiconductor laser diode device is provided, comprising: a) preparing a lead frame; b) forming at least one primary lead and secondary lead on the lead frame; c) forming a first resin member surrounding the primary lead and the secondary lead so as to insulate the primary lead and the secondary lead from each other while fixing the primary lead and the secondary lead; d) forming a second resin member surrounding the primary lead and the first resin member so as to dissipate heat transferred from the primary lead and second resin member to the outside while forming an emitting opening in the second resin member; e) disposing a laser diode on the primary lead; f) electrically connecting the laser diode to the secondary lead; and g) cutting the primary and secondary leads from the lead frame.

The step b) may form the primary lead having a diode-disposing portion and a leg, and form the secondary lead having a connecting portion and a leg by etching or punching the lead frame.

The method may further comprise forming latches to the legs of the primary and secondary leads.

The step c) may comprise forming an aperture through a portion of the first resin member corresponding to the upper end of the secondary lead.

The step c) may comprise forming flanges on the first resin member for enhancing an engaging force with the second resin member.

The first resin member may be formed of an insulation resin by means of injection molding or transfer molding.

The second resin member may be formed of an insulation resin by means of injection molding or transfer molding. The insulation resin may have a thermal conductivity of 1~40 W/mK. The insulation resin may comprise a metallic filler or a graphite filler.

The step d) may comprise forming a slant surface in the emitting opening of the second resin member for preventing the laser beam emitted from the laser diode from returning thereto.

The step e) may comprise bonding the laser diode to the sub-mount after mounting the sub-mount on the diode-disposing portion of the primary lead.

The step e) may mount the sub-mount on the diode-disposing portion of the primary lead after bonding the laser diode to the sub-mount.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Preferred embodiments will now be described in detail with reference to the accompanying drawings.

Figure 1:
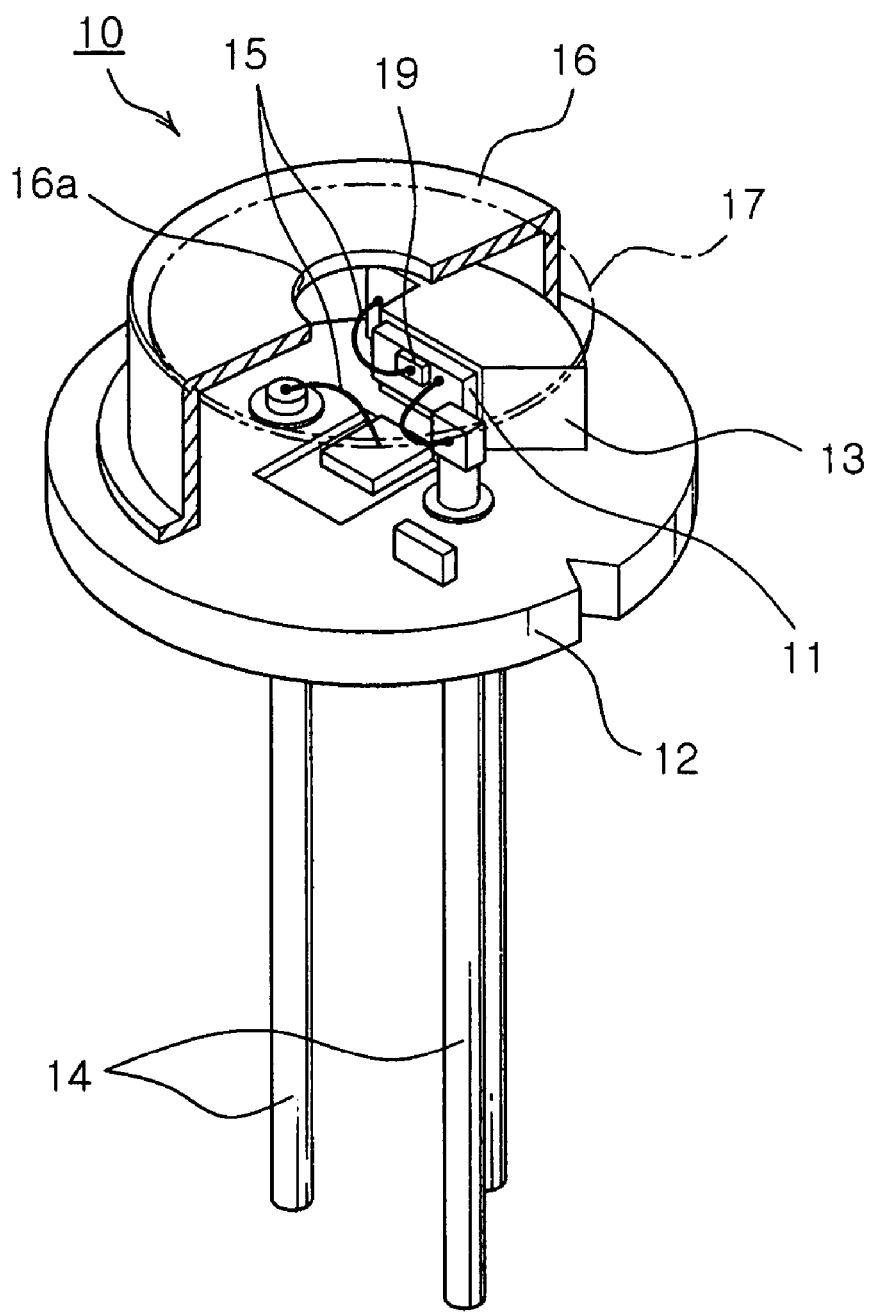
FIG. 1 is a perspective view illustrating a conventional cap-type semiconductor laser diode device.
Figure 2:
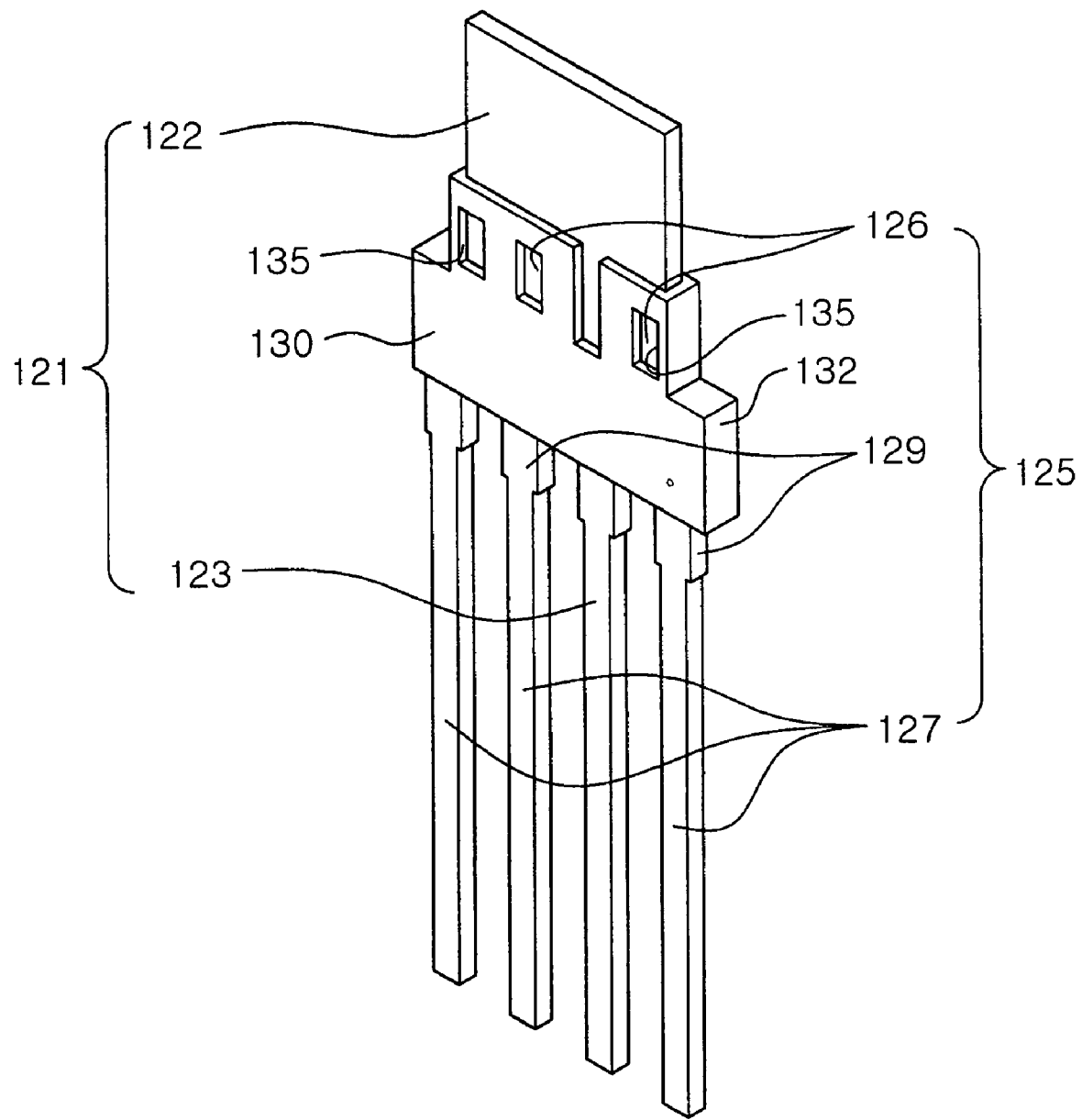
FIG. 2 is a perspective view of a semiconductor laser diode device according to one embodiment of the invention.
Figure 3:
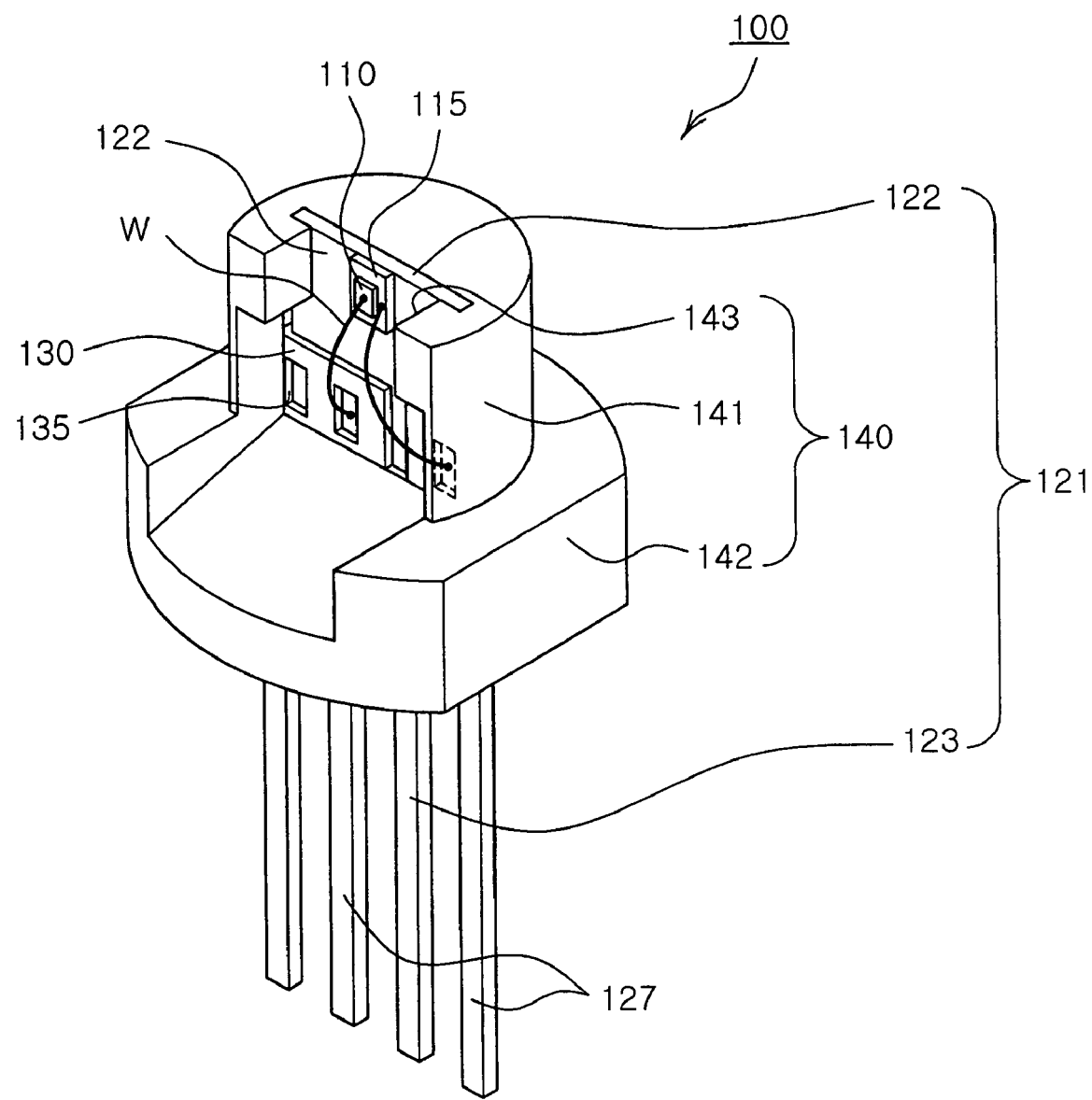
FIG. 3 is a perspective view of a first resin member formed to primary and secondary leads of the semiconductor laser diode device according to the embodiment.

FIG. 2 is a perspective view of a semiconductor laser diode device in accordance with one embodiment of the invention, and FIG. 3 is a perspective view of a first resin member formed to primary and secondary lead of the semiconductor laser diode device in accordance with the embodiment.

As shown in FIGS. 2 and 3, a semiconductor laser diode device 100 of the invention is designed to simplify an assembly process and reduce manufacturing costs by reducing the number of components, and to extend the life span of the products by ensuring excellent heat dissipation of the device while suppressing generation of static electricity by the device. The semiconductor laser diode device 100 comprises a semiconductor laser diode 110, a primary lead 121, a secondary lead 125, a first resin member 130, and a second resin member 140.

The semiconductor laser diode 110 (which will also be referred to as a "laser diode") is a heat source for generating laser beams while supplying heat upon application of power. The laser diode 110 is mounted on a sub-mount 115, which is made of materials having excellent thermal conductivity, and which can integrate a light receiving diode for a monitor.

Here, the laser diode 110 is made of materials, such as GaAlAs-based semiconductor materials consisting of an active layer and a clad layer surrounding the active layer, AlGaIn, AlGaInP or AlGaInPAs-based semiconductor materials used for red-light semiconductor laser diodes of high density optical disk, GaN-based semiconductor materials used for electronic devices such as transistors, and the like.

The laser diode 110 may be fixedly bonded to the top surface of the sub-mount 115 by means of soldering material, such as Au—Sn, Pb—Sn, and the like, or by means of boding material, such as Ag paste.

The sub-mount 115 integrating the light receiving diode is a light receiving diode having a Si matrix, and is adapted to monitor rear side emitted light of the laser diode 110. The sub-mount 115 may be made of ceramic or metallic materials, such as AlN, SiC, CuS and the like, having excellent thermal conductivity, as well as Si.

The primary lead 121 comprises a diode-disposing portion 122 having a wide area for disposing the sub-mount 115 having the semiconductor laser diode 110 mounted thereon, and a leg 123 extending a predetermined length downward from the diode-disposing portion 122.

Here, the sub-mount 115 may be fixedly bonded to the diode-disposing portion 122 of the primary lead 121 by means of soldering material, such as Au—Sn, Pb—Sn, Au—Sn, Sn—Bi, and the like, or by means of Ag paste.

At this time, the diode-disposing portion 122 is partially exposed at a front side thereof to the outside through the first resin member 130, and is surrounded by the second resin member 140.

The secondary lead 125 is fixed in position by the first resin member 130 so as to be electrically insulated from the primary lead 121 having the semiconductor laser diode 110, and is electrically connected to the semiconductor laser diode 110 or to the sub-mount 115 via a wire W.

The secondary lead 125 comprises one or more connecting portions 126 exposed to the outside through one or more apertures 135 formed through the first resin member 130 and electrically connected to one end of the wire W, and one or more legs 127 vertically extending a predetermined length downward below the connecting portions 126 and disposed in parallel to the leg 123 of the primary lead 121.

The primary lead 121 may be made of metallic materials having excellent thermal conductivity so as to allow heat generated from the laser diode 110 to be easily dissipated to a main substrate. The secondary lead 125 may be made of metallic electrode materials so as to allow easy electric connection between the laser diode 110, the sub-mount 115, and the main substrate.

The primary and secondary leads 121 and 125 are provided at the same positions thereof with latches 129 at respective middle portions of the legs 123 and 127 so as to adjust an insertion depth of the legs 123 and 127 upon assembling the legs 123 and 127 to the main substrate, respectively.

The one or more apertures 135 are formed at the front side of the first resin member 130 so as to expose the connecting portions 126 of the secondary lead 125 to the outside, whereby the wire W having one end bonded to the laser diode 110 or to the sub-mount 115 is wire-bonded at the other end thereof to the connecting portions 126.

The first resin member 130 is formed with flanges 132 extended from both sides of the first resin member 130 so as to increase an engaging force between the first and second resin members 130 and 140 by enlarging an engaging area between the first and second resin members 130 and 140.

The first resin member 130 is formed of resins, such as PC, PA, PPS, LSP and EMC, by means of injection molding or transfer molding, such that the primary lead 121 can be electrically insulated from the secondary lead 125.

Meanwhile, the second resin member 140 is a resin body, which contacts the primary lead 121 and the first resin member 130 while surrounding the diode-disposing portion 122 of the primary lead 121 and some portion of the first resin member 130 so as to dissipate heat generated upon illumination of the laser beam to the outside.

The second resin member 140 comprises an upper resin body 141 surrounding the diode-disposing portion 122 and some portion of the first resin member 130 such that an emitting opening 143 for emitting a laser beam is formed in front of the diode-disposing portion 122 while exposing some portion of the first resin member 130 to the outside, and a lower resin body 142 surrounding the front and rear sides of the first resin member 130 while exposing the apertures 135 of the first resin member 130 to the outside.

Here, the resinous bodies of the second resin member 140 consist of resins, such as PC, PA, PPS, LSP and EMC, and fillers, such as metal or graphite, thereby providing excellent thermal conductivity. The mixing ratio of the resins and the fillers is appropriately determined according to conditions of injection molding or transfer molding the second resin member 140.

At this time, the second resin member 140 is preferably constituted by the resinous bodies having a thermal conductivity of 1~40 W/mK.

Accordingly, heat generated from the laser diode 110 and then transferred to the primary lead 121 and the first resin member 130 can be easily dissipated to the outside through the second resin member 140 having the excellent thermal conductivity, thereby minimizing generation of static electricity from the first resin member 130, and preventing attachment of foreign substances.

Figure 4:
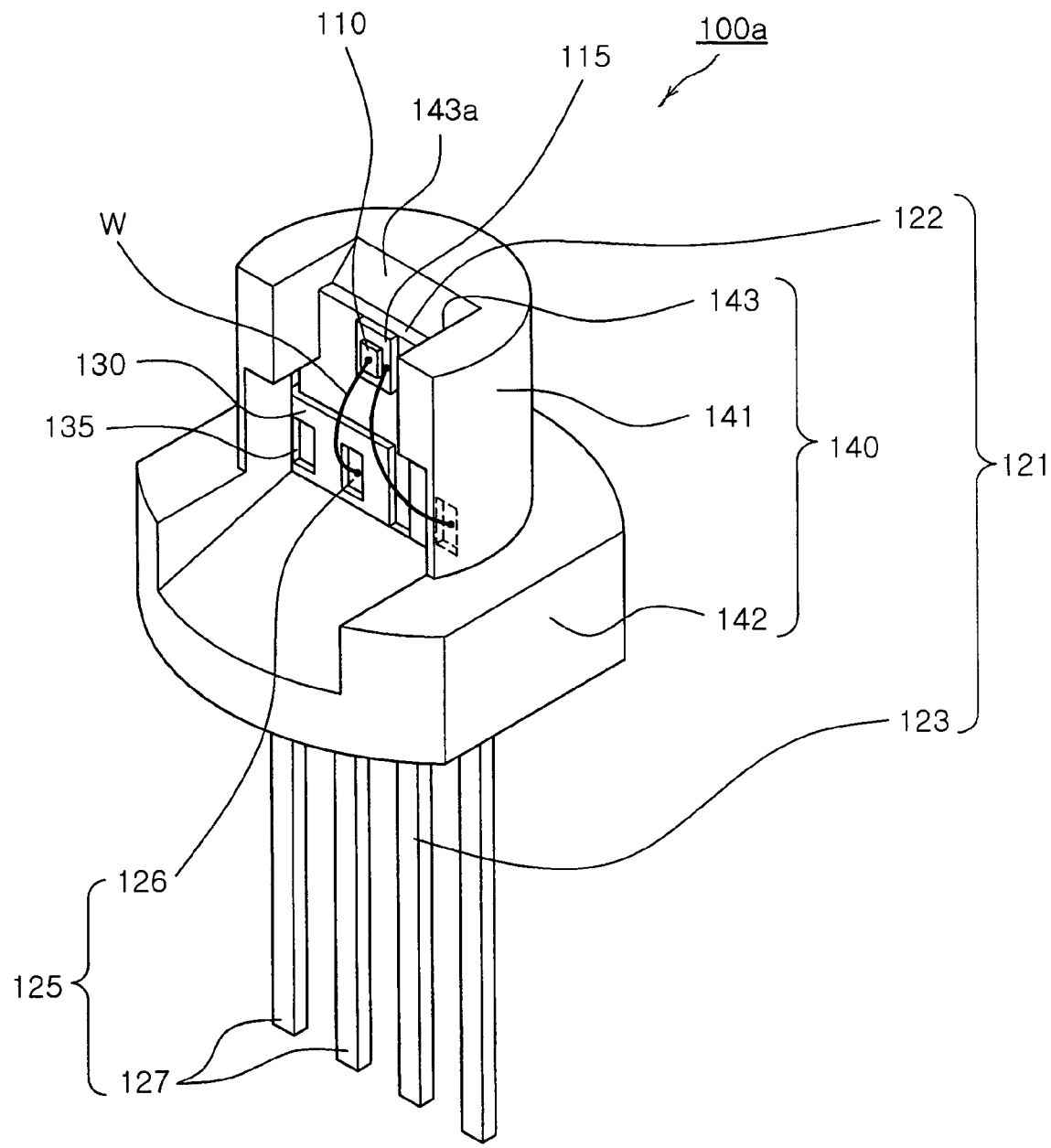
FIG. 4 is a perspective view of a semiconductor laser diode device according to another embodiment of the invention.

The emitting opening 143 of the second resin member 140 is preferably provided, as shown in FIG. 4, with a slant surface 143 so as to prevent the laser beam emitted from the laser diode 110 from returning thereto while enlarging an emitted angle of the laser beam.

Figure 5:
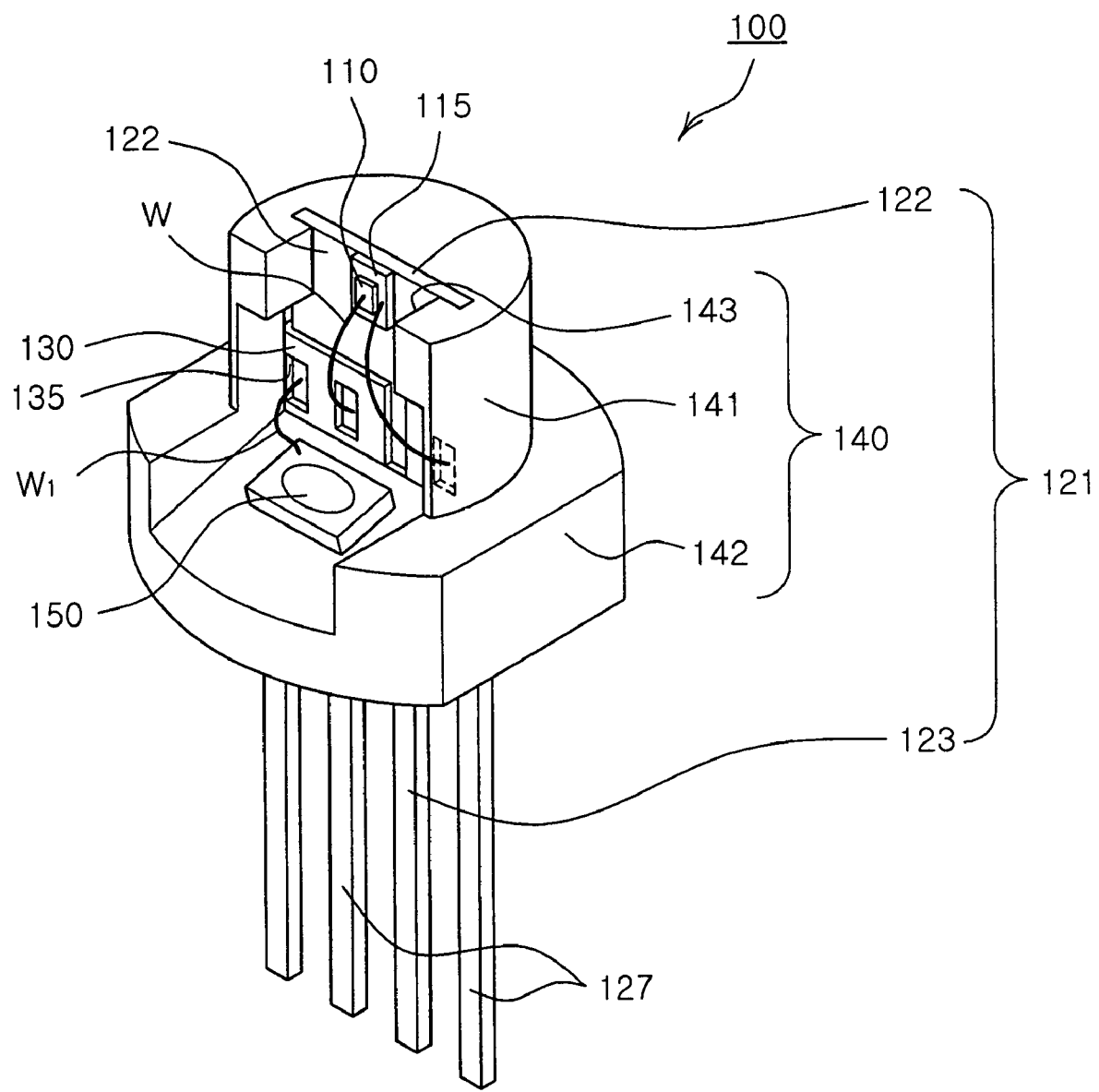
FIG. 5 is a perspective view of a semiconductor laser diode device according to yet another embodiment of the invention.

A light receiving diode 150 for monitoring rear side emitted light is provided to a light receiving region where the laser beam emitted from the laser diode 110 is received, and, as shown in FIG. 5, it can be disposed at one side surface of the second resin member 140 adjacent to the laser diode 110, in which the second resin member 140 can be used as one electrode electrically connected to the light receiving diode 150, and the secondary lead 125 can be used as another electrode wire-bonded to the light receiving diode 150 via a wire W.

Additionally, the light receiving diode 150 may be integrally mounted on the top surface of the sub-mount 115 having the semiconductor laser diode 110 mounted thereon. Alternatively, the light receiving diode 150 may be separately mounted on the primary lead 121 having the sub-mount 115 mounted thereon.

At this time, when the light receiving diode 150 is disposed on one of the second resin member 140, the sub-mount 115, and the primary lead 121, it must be located within the light receiving region, which enables the rear side emitted light to be monitored.

FIGS. 6a to 6f are diagrams illustrating steps for manufacturing the semiconductor laser diode device according to the embodiment of the present invention, respectively.

Figure 6A:
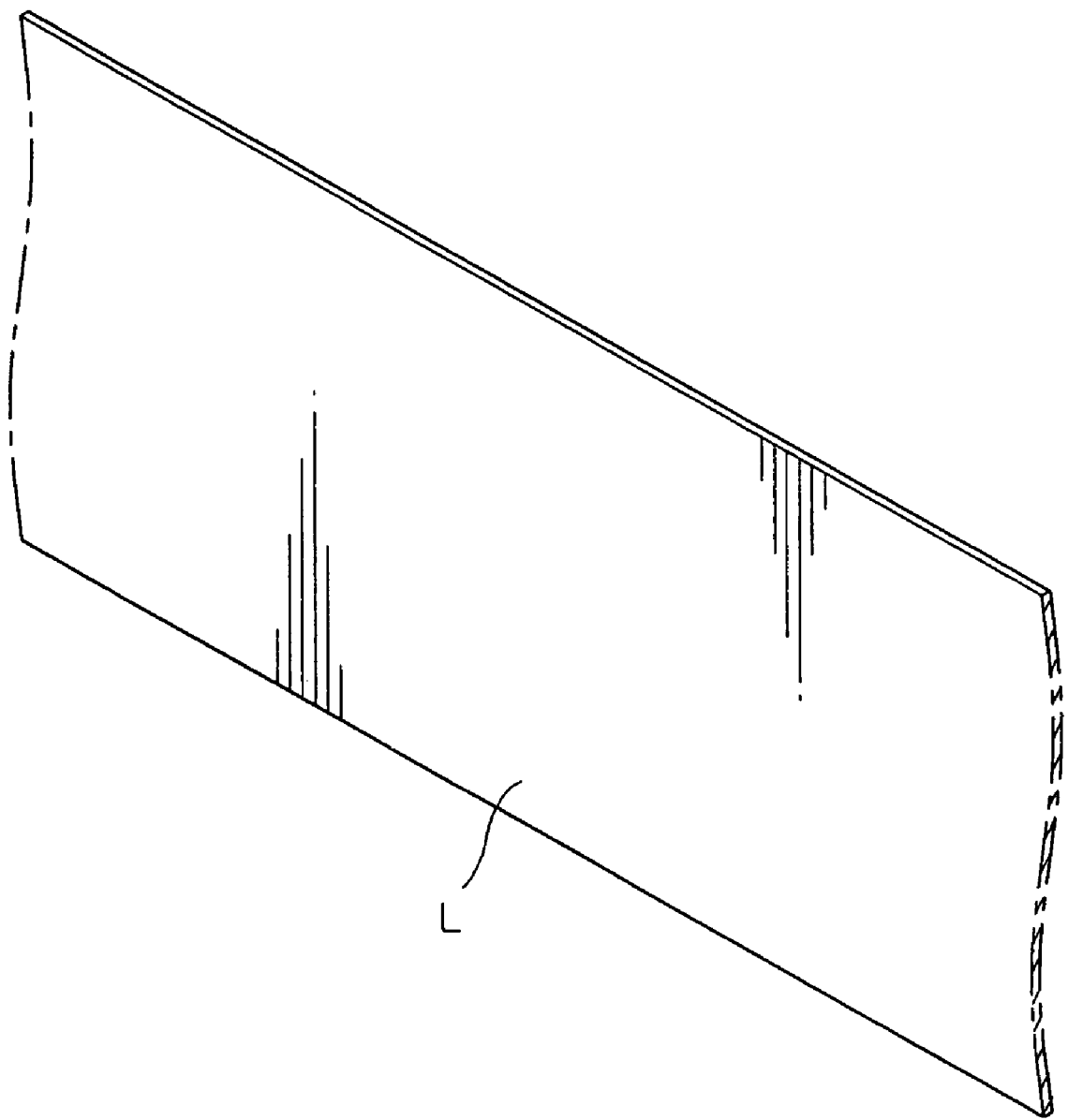
FIGS. 6a to 6f are diagrams illustrating steps for manufacturing the semiconductor laser diode device according to the embodiment of the invention, respectively.
Figure 6B:
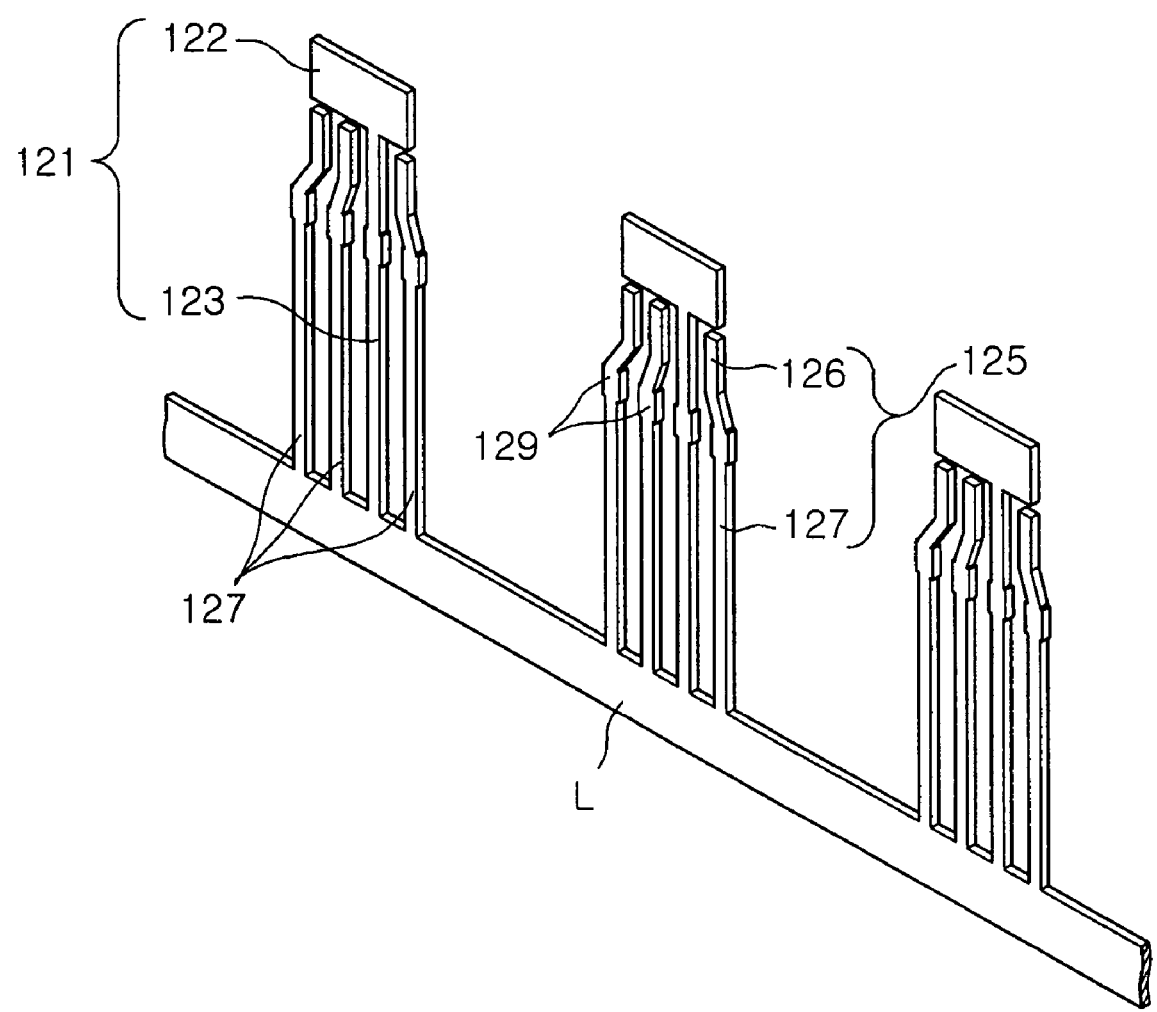

First, as shown in FIG. 6a, a lead frame L having excellent thermal and electric conductivity while having excellent workability is prepared for providing primary leads 121 and secondary leads 125.

The lead frame L is processed into the primary leads 121, each having a diode-disposing portion 122 and a leg 123, and the secondary leads 125 having connecting portions 126 and legs 127 by punching or etching, in which the legs 123 and 127 are provided with latches 129 at the same height, respectively.

Here, although the device of the present embodiment has been described as having one primary lead 121 having the bottom end of the leg 123 integrally connected to the lead frame L, and three secondary leads 125 having the bottom end of the leg 127 integrally connected to the lead frame L, the primary lead and secondary leads are not limited to this number, and may be variously provided.

Figure 6C:
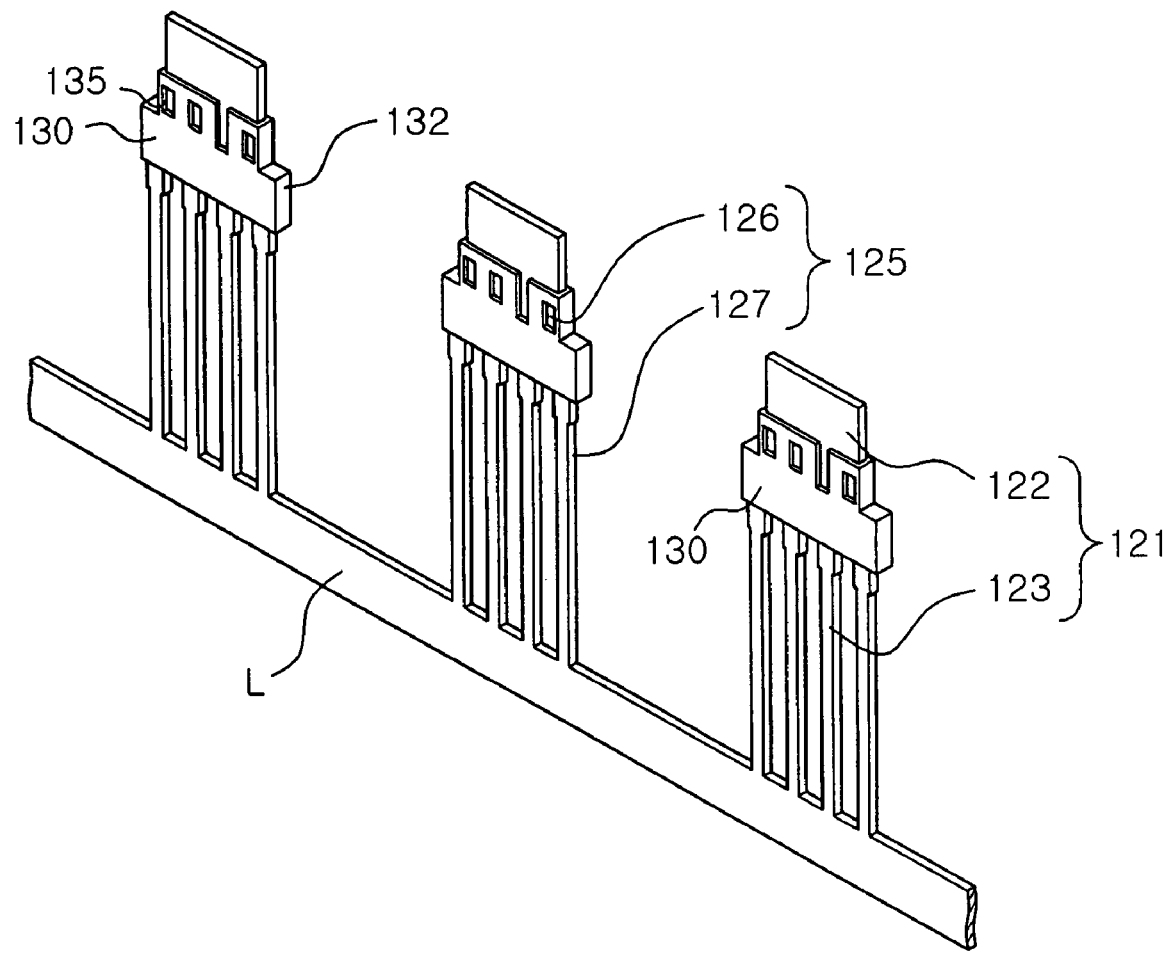

Next, as shown in FIG. 6c, each of the primary resin members 130 is formed to surround connected portions between the diode-disposing portion 122 and the leg 123, and between the connecting portions 126 and the legs 127 by injection molding or transfer molding, so that most of the diode-disposing portion 122, and legs 123 and 127 are exposed to the outside.

Apertures 135 for exposing the connecting portions at the upper end of each secondary lead 125 to the outside are formed at the front side of the first resin member 130, and at the same time, flanges 132 are formed on both sides of the first resin member 130 for increasing an engaging force between the first and second resin members 130 and 140 upon molding the second resin member 140.

Figure 6D:
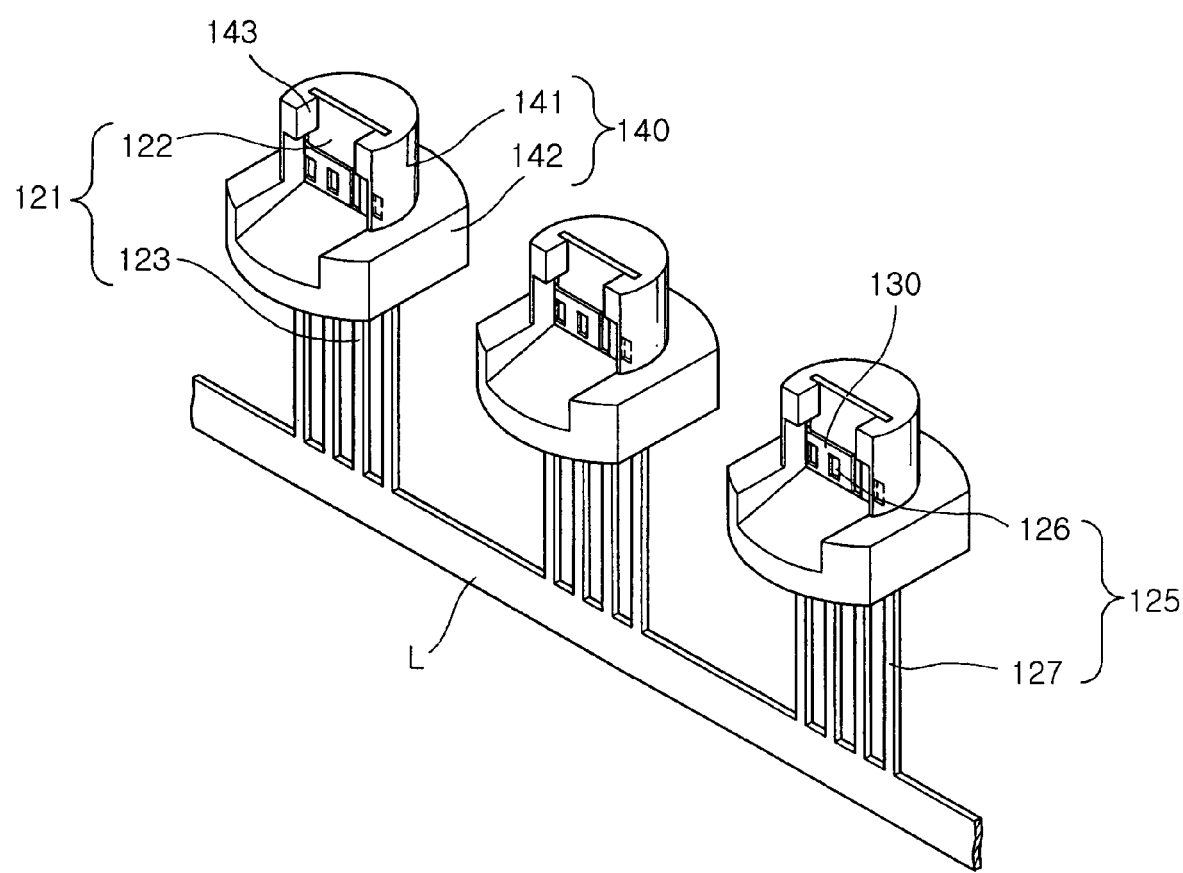

Then, as shown in FIG. 6d, the primary lead 121 and the first resin member 130 are surrounded by a thermally conductive resin, such as PC, PA, PPS, LSP and EMC, comprising metallic fillers, and the second resin member 140 is formed by injection molding or transfer molding such that an emitting opening 143 through which laser beams can be emitted without interference is formed in front of the diode-disposing portion 122.

Figure 6E:
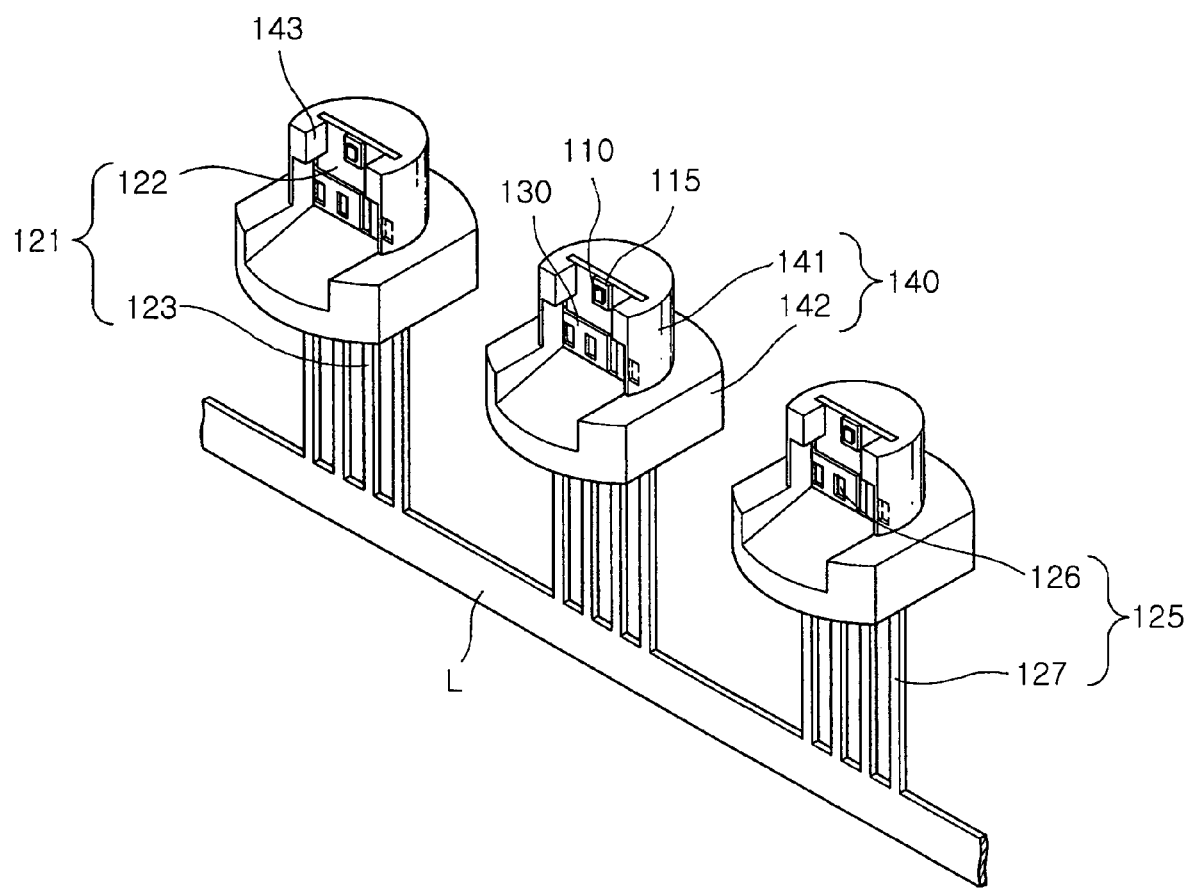

Additionally, as shown in FIG. 6e, the sub-mount 115 having the laser diode 110 bonded to the top surface of the sub-mount 115 is mounted on the diode-disposing portion 122 of the primary lead 121. Alternatively, after the sub-mount 115 is bonded to the diode-disposing portion 122, the laser diode 110 may be bonded to the top surface of the sub-mount 115.

At this time, the sub-mount 115 is preferably mounted on the diode-disposing portion 122 to be disposed on the perpendicular axis approximately coaxial with the center of the emitting opening 143.

Figure 6F:
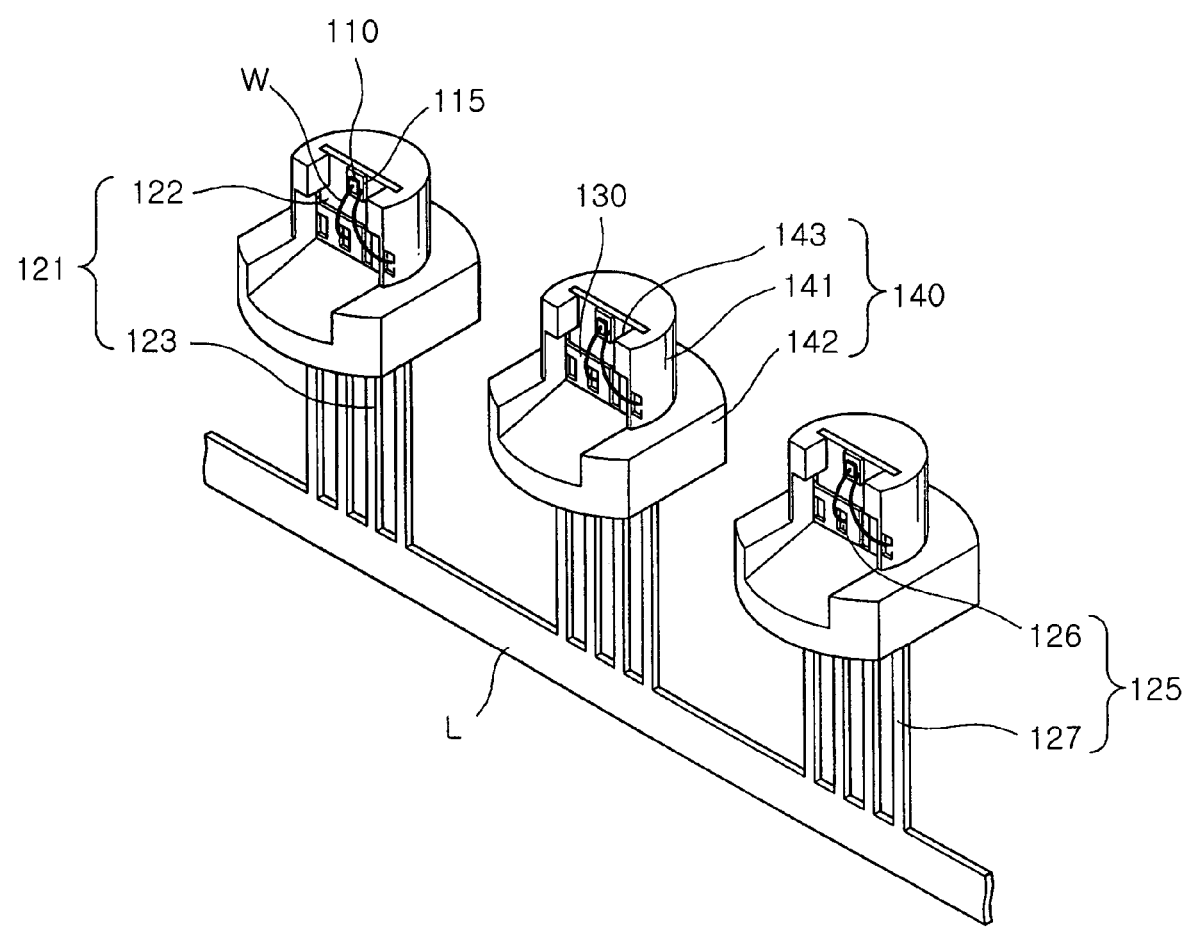

Moreover, when completing disposition of the laser diode 110 on the diode-disposing portion 122 of the first lead 121, as shown in FIG. 6f, a wire W is wire-bonded at one end to the sub-mount 115 or to the laser diode 110 while being wire-bonded at the other end to the connection portion 126 of the secondary lead 125 so that the these components can be electrically connected to each other while the primary lead 121 is insulated from the secondary lead 125 by means of the first resin member 130.

Then, cutting is performed along the border between the lower ends of the primary and secondary leads 121 and 125 and the lead frame L in a cutting process such that the primary and secondary leads 121 and 125 are separated from the lead frame L, thereby providing a plurality of semiconductor laser diode devices, each having the first and second resin members 130 and 140, simultaneously.

Meanwhile, when a voltage is applied to the laser diode 110 of the semiconductor laser diode device 100 mounted on a main substrate, laser beams generated by the laser diode 110 are emitted from the semiconductor laser diode device 100 through the emitting opening 143 of the second resin member 140.

At this time, heat generated upon emission of the laser beam is transferred to the diode-disposing portion 122 through the sub-mount 115, and is then dissipated to the main substrate through the leg 123, as well as being dissipated through the sub-mount 115.

Additionally, the heat transferred to the first resin member 130 surrounding the primary and secondary leads 121 and 125 is transferred to the second resin member 140 surrounding the diode-disposing portion 122 and the first resin member 130. Meanwhile, since the second resin member 140 is made of the thermally conductive resin, it can easily dissipate the heat to the outside, thereby preventing overheating of the semiconductor laser diode device 100.

As apparent from the above description, according to the present invention, the first resin member is formed by injection molding or transfer molding so as to electrically insulate the primary lead from the secondary lead by means of the insulation resin, and then the second resin member is formed by injection molding or transfer molding so as to surround these components by means of the thermally conductive resin, so that the heat transferred to the first resin member is easily dissipated to the outside, providing excellent heat dissipation while suppressing generation of the static electricity, thereby remarkably extending the life span of the products.

Furthermore, not only are the number of components reduced but also the assembly process is simplified, thereby reducing manufacturing costs, leading to enhancing price competitiveness of the products.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A semiconductor laser diode device, comprising:
   a semiconductor laser diode;
   a primary lead having a diode-disposing portion on which a sub-mount is provided for mounting the semiconductor laser diode;
   at least one secondary lead electrically insulated from the primary lead;
   a first resin member formed of an insulation resin molded onto the primary lead and the secondary lead to integrally fix the primary lead to the secondary lead and insulate the primary lead from the secondary lead; and a second resin member formed of a thermally conductive resin molded onto the primary lead and the first resin member to surround the primary lead and the first resin member so as to dissipate, in use, heat transferred to the primary lead and the first resin member to an outside of the device, said thermally conductive resin extending around and defining an emitting opening through which laser beams generated by the semiconductor laser diode are emittable to the outside of said device.

2. The device as set forth in claim 1, wherein the secondary lead comprises at least one connecting portion electrically connected to the semiconductor laser diode or to the sub-mount via a wire, a leg extending a predetermined length downward below the connecting portion, and a latch formed at the middle of the leg.

3. The device as set forth in claim 1, wherein the primary lead further comprises a leg extending a predetermined length downward from the diode-disposing portion, and a protruded portion formed at the middle of the leg.

4. The device as set forth in claim 2, wherein the first resin member is provided with an aperture exposing the connecting portion of the secondary lead to the outside.

5. The device as set forth in claim 1, wherein the first resin member is provided with flanges on an outer surface of the first resin member corresponding to the second resin member for enhancing an engaging force between the first resin member and the second resin member.

6. The device as set forth in claim 1, wherein the thermally conductive resin is a resinous material having a thermal conductivity of 1~40 W/mK.

7. The device as set forth in claim 1, wherein the thermally conductive resin comprises metallic fillers.

8. The device as set forth in claim 1, wherein the thermally conductive resin comprises graphite fillers.

9. The device as set forth in claim 3, wherein the thermally conductive resin extending around the emitting opening defines a slant surface which extends obliquely from the diode-disposing portion of the primary lead upwardly away from the leg and rearwardly away from the semiconductor laser diode so as to prevent the laser beam emitted by the semiconductor laser diode from returning thereto.

10. The device as set forth in claim 1, further comprising:
a light receiving diode for monitoring rear side emitted light.

11. The device as set forth in claim 10, wherein the light receiving diode is integrally provided to the sub-mount.

12. The device as set forth in claim 10, wherein the light receiving diode is provided to the primary lead so as to be separate from the sub-mount.

13. The device as set forth in claim 10, wherein the light receiving diode is provided to an inner wall of the second resin member.

14. A method of manufacturing a semiconductor laser diode device comprising a sub-mount for mounting a semiconductor laser diode; a primary lead having a diode-disposing portion on which the sub-mount is provided; and at least one secondary lead electrically insulated from the primary lead, the method comprising:

forming a first resin member by either injection molding or transfer molding of an insulation resin directly onto the primary lead and the secondary lead, wherein the insulation resin surrounds the primary lead and the secondary lead and insulates the primary lead and the secondary lead from each other while fixing the primary lead to the secondary lead and exposing the diode-disposing portion of the primary lead; and forming a second thermally conductive resin member by either injection molding or transfer molding of a thermally conductive resin directly onto the primary lead and the first resin member, wherein the thermally conductive resin surrounds the primary lead and the first resin member so as to dissipate, in use, heat transferred to the primary lead and the first resin member to an outside of the device, said thermally conductive resin extending around and defining an emitting opening through which laser beams generated by the semiconductor laser diode are emittable to the outside.

15. The method as set forth in claim 14, wherein the first resin member is formed with an aperture exposing at least one connecting portion formed on an upper end of the secondary lead to the outside.

16. The method as set forth in claim 14, wherein flanges are formed on an outer surface of the first resin member corresponding to the second resin member for enhancing an engaging force with the second resin member.

17. The method as set forth in claim 14, wherein the thermally conductive resin is a resinous material having a thermal conductivity of 1~40 W/mK.

18. The method as set forth in claim 14, wherein the thermally conductive resin comprises metallic fillers.

19. The method as set forth in claim 14, wherein the thermally conductive resin comprises graphite fillers.

20. The method as set forth in claim 14, wherein
the primary lead further comprises a leg extending a predetermined length downward from the diode-disposing portion, and
the thermally conductive resin extending around the emitting opening defines a slant surface which extends obliquely from the diode-disposing portion of the primary lead upwardly away from the leg and rearwardly away from the semiconductor laser diode so as to prevent the laser beam emitted by the semiconductor laser diode from returning thereto.

21. A method of manufacturing a semiconductor laser diode device, said method comprising:

forming at least one primary lead and secondary lead on a lead frame;

forming a first resin member by either injection molding or transfer molding of an insulation resin directly onto the primary lead and the secondary lead, wherein the insulation resin surrounds the primary lead and the secondary lead and insulates the primary lead and the secondary lead from each other while fixing the primary lead to the secondary lead and exposing a diode-disposing portion of the primary lead;

forming a second thermally conductive resin member by either injection molding or transfer molding of a thermally conductive resin directly onto the primary lead and the first resin member, wherein the thermally conductive resin surrounds the primary lead and the first resin member so as to dissipate, in use, heat transferred to the primary lead and the first resin member to an outside of the device, said thermally conductive resin extending around and defining an emitting opening through which laser beams generated by the semiconductor laser diode are emittable to the outside;

mounting a laser diode on the diode-disposing portion of the primary lead;

electrically connecting the laser diode to the secondary lead; and cutting the primary and secondary leads from the lead frame.

22. The method as set forth in claim 21, wherein
the primary lead is formed with the diode-disposing portion and a leg,
the secondary lead is formed with at least one connecting portion and at least one leg, and
said leads are formed by etching or punching the lead frame.

23. The method as set forth in claim 22, wherein latches are formed to the legs of the primary and secondary leads, respectively.

24. The method as set forth in claim 21, wherein the first resin member is formed with at least one aperture corresponding to an upper end of the secondary lead.

25. The method as set forth in claim 21, wherein the first resin member is formed with flanges for enhancing an engaging force with the second resin member.

26. The method as set forth in claim 21, wherein the thermally conductive resin is a resinous material having a thermal conductivity of 1~40 W/mK.

27. The method as set forth in claim 21, wherein the thermally conductive resin comprises metallic fillers.

28. The method as set forth in claim 21, wherein the thermally conductive resin comprises graphite fillers.

29. The method as set forth in claim 22, wherein the thermally conductive resin extending around the emitting opening defines a slant surface which extends obliquely from the diode-disposing portion of the primary lead upwardly away from the leg and rearwardly away from the semiconductor laser diode for preventing the laser beam emitted from the laser diode from returning thereto.

30. The method as set forth in claim 21, wherein the mounting comprises bonding the laser diode to a sub-mount after mounting the sub-mount on the diode-disposing portion of the primary lead.

31. The method as set forth in claim 21, wherein the mounting comprises mounting a sub-mount on the diode-disposing portion of the primary lead after bonding the laser diode to the sub-mount.

32. The method as set forth in claim 14, wherein said diode and the sub-mount are both exposed from, without being embedded in, both said first and second resin members.

33. The method as set forth in claim 32, wherein the second resin member is formed to be in direct thermal and physical contact with portions of the first resin member and the diode-disposing portion of the primary lead which are surrounded by and embedded within said second resin member.

34. The device as set forth in claim 1, wherein said diode and the sub-mount are both exposed from, without being embedded in, both said first and second resin members.

35. The device as set forth in claim 34, wherein the second resin member is in direct thermal and physical contact with portions of the first resin member and the diode-disposing portion of the primary lead which are surrounded by and embedded within said second resin member.

36. The device as set forth in claim 35, wherein the second resin member is free of direct contact with wires that electrically connect the secondary lead to the semiconductor laser diode and to the sub-mount, said wire being exposed in said emitting opening of the second resin member.

37. The device as set forth in claim 35, wherein the thermally conductive resin defines
a lower portion that extends for full 360 degrees around the first resin member and has an inner surface in direct thermal and physical contact with an outer surface of the first resin member; and
an upper portion that extends for less than full 360 degrees but more than 180 degrees around the first resin member and the diode-disposing portion of the primary lead to define said emitting opening and has an inner surface in direct thermal and physical contact with an outer surface of the first resin member and the diode-disposing portion of the primary lead.

38. The method as set forth in claim 21, wherein said diode is exposed from, without being embedded in, both said first and second resin members.

39. The method as set forth in claim 38, wherein the second resin member is formed to be in direct thermal and physical contact with portions of the first resin member and the diode-disposing portion of the primary lead which are surrounded by and embedded within said second resin member.

40. The method of claim 39, wherein the steps of mounting the laser diode on the diode-disposing portion of the primary lead and electrically connecting the laser diode to the secondary lead are both performed (i) after the step of forming the second thermally conductive resin member and (ii) through the emitting opening of the second thermally conductive resin member.

* * * * *